(12) United States Patent
Lee

(10) Patent No.: US 6,348,682 B1
(45) Date of Patent: Feb. 19, 2002

(54) PHOTODETECTOR CIRCUIT AND METHODS

(75) Inventor: See T. Lee, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 09/439,916

(22) Filed: Nov. 12, 1999

(51) Int. Cl.[7] .............................................. H01L 31/00
(52) U.S. Cl. .............................. 250/214 A; 250/214.1; 327/514
(58) Field of Search ......................... 250/214 R, 214.1, 250/214 A, 551; 327/514

(56) References Cited

U.S. PATENT DOCUMENTS 5,677,779 A * 10/1997 Oda et al. .................... 359/152
6,278,103 B1 * 8/2001 Takami ................... 250/214 R

FOREIGN PATENT DOCUMENTS

| EP | 0 416 469 | 3/1991 | ................... 1/365 |
| JP | 11239108 | 8/1999 | |

* cited by examiner

Primary Examiner—Stephone Allen
(74) Attorney, Agent, or Firm—Fish & Neave; Michael E. Shanahan (57) ABSTRACT

A photodetector circuit that operates a reduced power levels is provided. The photodetector circuit preferably includes a control circuit that alternates between an active mode and a standby mode. During an active mode, information regarding the relative strength of a light signal is acquired and reported. However, during a standby mode, portions of the photodetector are disabled or turned off so that no information regarding a light signal is acquired or reported and overall power consumption is reduced.

48 Claims, 9 Drawing Sheets

PHOTODETECTOR CIRCUIT AND METHODS

BACKGROUND OF THE INVENTION

This invention relates to photodetector circuits. More particularly, this invention relates to the portions of a photodetector circuit that are used to convert a light signal to an electrical signal.

A photodetector is a device used for converting the photon energy of a light source into a photocurrent. In general, photodetectors are used in many practical applications such as communications, security systems, optical analyzing instruments, and other modern electronic devices. Typically, photodetector circuits include an amplifying stage connected to the photodetector for producing an analog voltage signal proportional to the photocurrent.

In many applications, the analog voltage signal from the amplifying stage is applied to a comparator circuit in order to determine the relative strength of the light signal with respect to a preset threshold voltage. If the analog signal is less than the threshold voltage, the comparator circuit may trip and produce a logic high at its output. However, if the analog signal is greater than the threshold voltage, the comparator circuit may generate a logic low at its output.

This type of circuit is often used to create an object detector that can determine the presence or absence of an object within a specific region. For example, a photodetector circuit may be arranged so that a light emitting diode (LED) constantly projects a beam of light on to the photodetector. As long as the light beam is uninterrupted, the photodetector produces a sufficient photocurrent, and the output of the comparator circuit remains at a logic low. However, when an object blocks the light signal, the photodetector turns OFF, and the output of the comparator circuit becomes a logic high.

Figure 1:
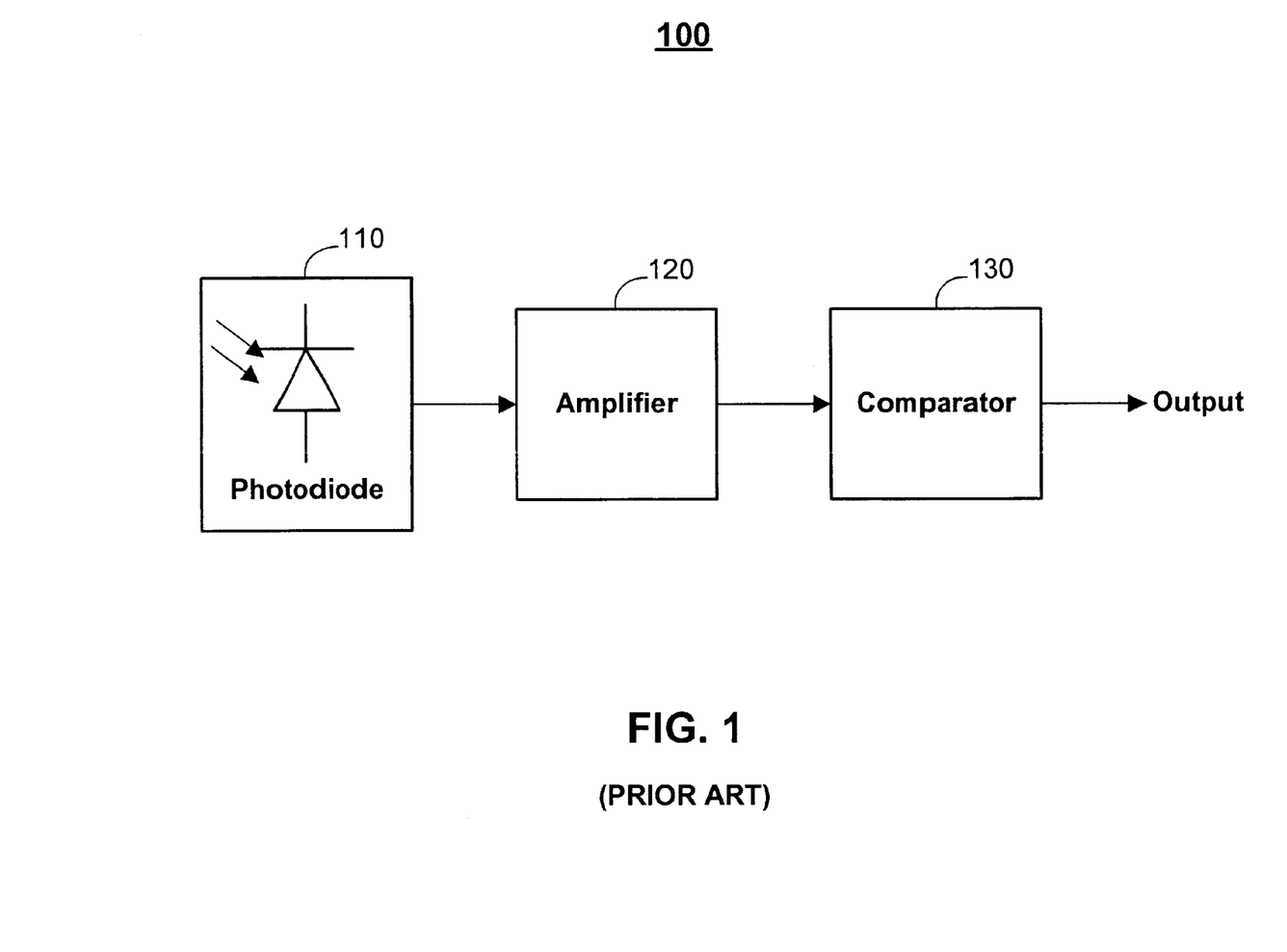
FIG. 1 is a block diagram of a prior art infrared photodetector.

A block diagram of a typical prior art photodetector system 100 is shown in FIG. 1. System 100 generally includes a photodiode 110, an amplifier circuit 120 and a comparator circuit 130. Infrared light incident upon photodiode 110 creates a small photocurrent that is changed into a voltage and amplified by amplifier circuit 120. Comparator circuit 130 compares the amplified signal with a preset threshold value to determine whether it is greater or less than the threshold value. If the amplified signal is less than the threshold, comparator 130 trips generating a logic high at its output. This means that the level of infrared light sensed by photodiode 110 has fallen below a minimum value, indicating a lack of infrared light. When the amplified signal is greater than the threshold value, comparator 130 supplies a logic low at its output, indicating that a sufficient amount of infrared light is detected.

Photodetector system 100 may be used in conjunction with other components for determining the presence or absence of objects. For example, assume a light emitting diode (shown in FIG. 2 as LED 160) is positioned to constantly project a beam of infrared light upon photodiode 110. This creates a "sensing field" 170 between LED 160 and photodiode 110 within which objects can be detected. As long as the path of light from LED 160 to photodiode 110 is uninterrupted, a sufficient amount of current will be continuously generated by photodiode 110 so that the output of comparator 130 remains at a logic low. However, when an object enters sensing field 170, the beam of infrared light is interrupted and photodiode 110 turns "OFF" (i.e., ceases to conduct). This causes comparator 130 to trip and produce a logic high at its output. The presence or absence of an object within sensing field 170 may be determined by examining the output of comparator 130. If the output is a logic high, an object is present in the sensing field, if the output is a logic low an object is not present.

Figure 2:
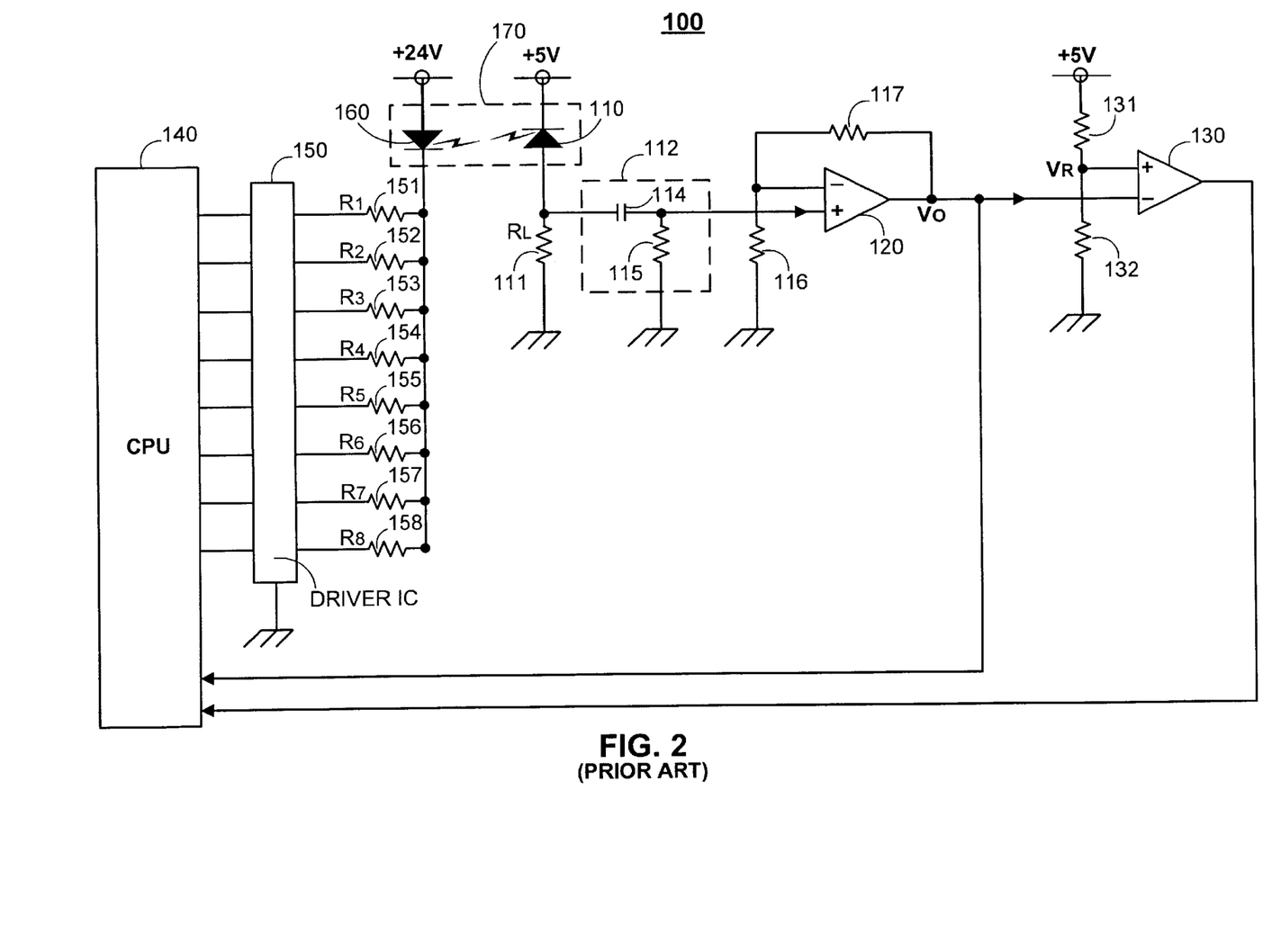
FIG. 2 is a schematic diagram of the infrared photodetector shown in FIG. 1.

A schematic diagram of photodetection system 100 is shown in FIG. 2. As shown in FIG. 2, photodiode 110 is reverse-biased with its anode connected to ground through resistor 111 and its cathode connected to a +5V power source. LED 160 is forward biased with its anode connected to +24V power source and its cathode selectively connected to ground through one of resistors 151–158. Each resistor has a different value (151>152> . . . 158). The intensity of the infrared light supplied by LED 160 is determined by the value of the resistor it is connected to. For example, if LED 160 is connected to the resistor with the smallest value (i.e., resistor 158), a relatively large amount of current will flow through it, causing LED 160 to produce the greatest quantity of light. Conversely, If LED 160 is connected to the resistor with the largest value (i.e., resistor 151), a relatively small amount of current will flow through it, causing LED 160 to provide the least quantity of light.

When photodiode 110 receives an infrared beam from LED 160, the reverse-bias leakage current across it increases causing a voltage to be generated across resistor 111 ($R_L$). This voltage is applied to the non-inverting input of operational amplifier (op-amp) 120 through a high-pass filter 112 formed by capacitor 114 and resistor 115. The gain of op-amp 120 is controlled by the ratio of resistors 116 and 117. The amplified output voltage $V_o$ of op-amp 120 is applied to the inverting terminal of comparator 130. A threshold voltage $V_R$ created by series coupled resistors 131 and 132 is applied to the non-inverting terminal of comparator 130. When the output voltage of op-amp 120 is less than the threshold voltage, the output of comparator 130 is high, when the output of op-amp 120 is less, it is low.

The output signal of comparator 130 is fed to a microcomputer 140. Microcomputer 140 reads this output signal so that it may determine whether an object is present within sensing field 170. In addition, the output of op-amp 120 is also fed to microcomputer 140 so that it may monitor the magnitude of the amplifier's output signal. Microcomputer 140 selects a resistor value based on this output signal and transmits a control signal to driver 150 in order to adjust the intensity of the light produced by LED 160.

One deficiency of photodetection system 100 is that LED 160, which is connected to the +24V power supply, is constantly on and therefore consuming a significant amount of power. In addition, changing the overall gain of photodetection system 100 poses several practical problems. For example, changing the gain of system 100 involves adjusting the value of the feedback resistor connected to an input pin of op-amp 120. This is generally an undesirable way of adjusting the gain due to the sensitivity of the op-amp to conditions at the input pin. Furthermore, having an external pin that connects to the input of op-amp 120 adds parasitic capacitance to the op-amp's input, which reduces its phase margin. Although this problem can be solved by increasing power consumption, this solution is undesirable.

Thus, in view of the foregoing, it would be desirable to provide a photodetector circuit that operates at reduced power levels. It would also be desirable to provide a photodetector circuit that has an overall gain that can be adjusted by connecting an external resistor to a single external package pin.

SUMMARY OF THE INVENTION

It is therefore an object of the present invention to provide a photodetector circuit that operates at reduced power levels.

It is another object of the present invention to provide a photodetector circuit that has an overall gain that can be adjusted by connecting an external resistor to a single external pin.

In accordance with these and other objects of the present invention a photodetector circuit suitable for acquiring and reporting data indicative of the relative strength of a light signal is provided. The photodetector circuit is configured to alternate between standby and active periods in order to reduce overall power consumption.

The photodetector circuit includes a photodiode and a switch timing circuit that periodically generates a control signal. When the control signal is a logic low, an active period is initiated during which the photodetector may acquire and report light signal information. During a portion of the active period, an external LED is activated, causing it to generate a light signal. Assuming a sufficient amount of that light signal is reflected onto the photodiode, it conducts and generates a photocurrent. A variable gain transimpedance amplifier coupled to the photodiode amplifies the photocurrent and produces an analog voltage proportional to the amplified photocurrent.

While in the active mode, an auto-zero amplifier circuit coupled to the transimpedance amplifier amplifies the analog voltage and applies it to a comparator circuit. The comparator circuit compares the amplified analog voltage with a preset threshold value to determine whether it is greater or less than the threshold value. If the amplified signal is less than the threshold, the comparator trips generating a logic high at its output. If the amplified analog voltage is greater than the threshold value, the comparator supplies a logic low at its output. A digital filter may be coupled to the output of the comparator circuit to filter out spurious readings.

However, when the switch timing circuit generates a logic high control signal, the LED turns OFF, and the photodetector enters a standby mode. During the standby mode, the auto-zero amplifier initializes itself (i.e., sets its output to substantially zero), and the output of the comparator is set to a default logic state (i.e., either a logic low or logic high). Both the auto-zero amplifier the comparator remain in these respective disabled states during the standby mode so that no data is acquired or processed. In this mode, the power consumed by the photodetector circuit is significantly reduced. The photodetector circuit does not re-enter the active mode until switch timing circuit generates another logic low control signal.

These and other features and advantages of the present invention will become more apparent from the following detailed description of an exemplary embodiment thereof, as illustrated in the accompanying drawings.

DETAILED DESCRIPTION OF THE PREFERRED EMBODIMENTS

Figure 3:
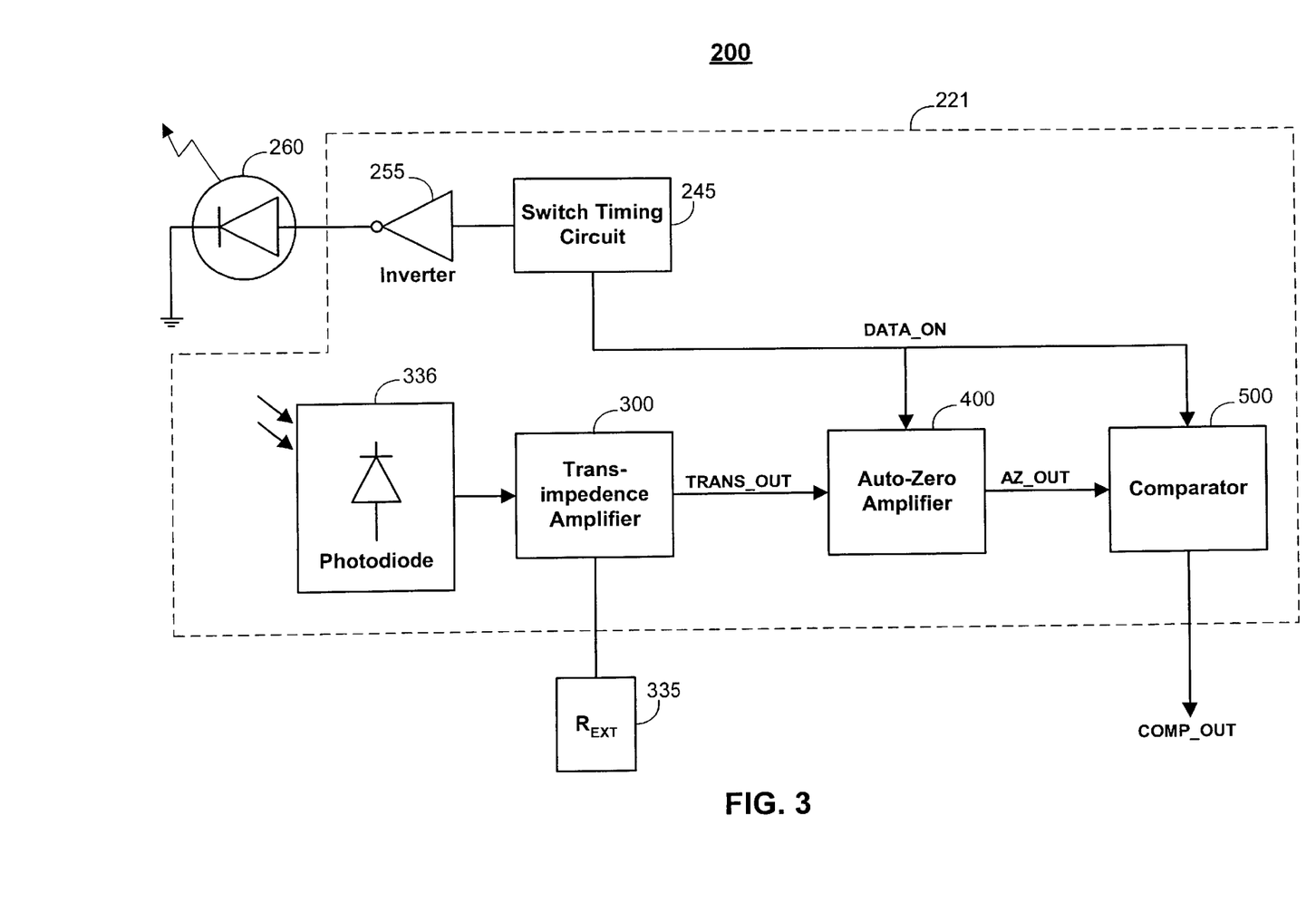
FIG. 3 is a block diagram of a basic photodetector circuit constructed in accordance with the principles of the present invention.

FIG. 3 is a block diagram of a photodetector circuit 200 constructed in accordance with the principles of the present invention. Photo-detector circuit 200 preferably comprises at least five sections: (1) an integrated photodiode 336, (2) a transimpedence amplifier circuit 300, (3) an auto-zero amplifier circuit 400, (4) a comparator circuit 500, and (5) a switch timing circuit 245.

Note that the photodetector circuit of FIG. 3 has been improved over the prior art systems shown in FIGS. 1 and 2 by replacing amplifier 120 with auto-zero amplifier 400 and by the addition of switch timing circuit 245. In FIG. 3, switch timing circuit 245 controls external LED 260, amplifier 400 and comparator 500.

The operation of photodetector 200 can be essentially divided into two modes, an "active" mode and a "standby" mode. During the active mode, photodetector 200 acquires and reports information regarding the relative strength of a light signal on photodiode 336. During the standby mode, however, portions of photodetector 200 are turned OFF or disabled, and information regarding the light signal is not acquired or reported.

Photodetector 200 does not need to continuously remain in the active mode to effectively obtain and report light signal information. This is because data regarding the relative strength of a light signal can be acquired and reported periodically rather than continuously without significantly compromising accuracy as long as the data acquisition (or "sampling") rate is sufficient for the intended application. For example, if it is desired to use photodetector 200 to sense the proximity of an object moving at an average velocity of ten meters per second, a sampling rate of 1000 hertz may employed so that the photodetector provides a proximity reading for every centimeter the object travels. If desired, this sampling rate can be varied to accommodate a wide variety of sensitivity requirements. Photodetector 200 takes advantage of this fact by alternating between active and standby modes. During standby mode, certain components are turned OFF or disabled so that the overall power consumption is reduced.

In operation, switch timing circuit 245 (which may include an oscillator, a constant time off one-shot, or any other suitable circuitry) periodically provides a DATA_ON control signal to external LED 260, auto-zero amplifier 400, and comparator 500. While the DATA_ON signal is a logic low, photodetector 200 is in the active mode. This means that amplifier 400 and comparator 500 are enabled and that inverter 255 provides a signal to LED 260 such that it turns ON and generates a light signal. Assuming that a sufficient amount of the light produced by LED 260 is reflected onto photodiode 336 (e.g., by a nearby object), photodiode 336 conducts and produces a small amount of photocurrent that is proportional to the intensity of the light. As the intensity of the light upon photodiode 336 increases, so does the photocurrent and vice versa. The photocurrent is amplified and converted into a voltage signal (TRANS_OUT) by transimpedence amplifier 300. Auto-zero amplifier 400 further amplifies the TRANS_OUT voltage, producing an output signal AZ_OUT. The gain of transimpedence amplifier 300 can be adjusted by varying the value of an external resistor 335 ($R_{EXT}$), As shown in FIG. 3, AZ_OUT is applied to an input of comparator 500 where it is compared with a user-selectable threshold voltage (not shown). If AZ_OUT is greater than the threshold voltage, the output of comparator 500 (COMP_OUT) will be a logic high, if AZ_OUT is less than the threshold voltage, COMP_OUT will be a logic low. Thus, the relative strength of a light signal (and therefore the presence or absence of an object) can be determined by examining the output of comparator 500. For example, if the output is a logic high, a sufficient amount of light has been reflected onto photodiode 336, indicating the presence of an object. However, if the output of comparator 500 is a logic low, an inadequate amount of light has been reflected onto photodiode 336, indicating the absence of an object. Comparator 500 preferably has a built-in amount of hysterisis so that relatively small fluctuations in the output of amplifier 400 will not cause the output of comparator 500 to change state.

During the active mode, LED 260, photodiode 336, transimpedence amplifier 300, auto-zero amplifier 400, and comparator 500 cooperate to provide data regarding the presence or absence of an object. However, when switch timing circuit 245 generates a logic high DATA_ON signal, LED 260 turns OFF, and photodetector 200 enters a standby mode. During the standby mode, amplifier 400 initializes itself (i.e., sets its output to substantially zero), and the output of comparator 500 becomes set to a default logic state (i.e., either a logic low or logic high). Both amplifier 400 and comparator 500 remain in these respective "disabled" states during the standby mode so that no data is acquired or processed. In this mode, the power consumed by photodetector 200 is significantly reduced. Photodetector 200 does not re-enter the active mode until switch timing circuit 245 generates another logic low DATA_ON signal.

If desired, portions of photodetector circuit 200 can be fabricated on a single "chip" or integrated circuit (e.g., as a DIP (dual in-line package) or a "can" type package, etc.). For example, the circuit elements contained within dotted line 221 (i.e., inverter 255, switch timing circuit 245, photodiode 336, transimpedence amplifier 300, auto-zero amplifier 400, and comparator 500) may be included on one integrated circuit. In the case of a can type package, for example, the "top" portion of the can may have an aperture region that allows light emitted by LED 260 to pass through and strike photodiode 336. The "bottom" portion of the can may contain a number of connection leads for connecting to external circuitry. For example, the bottom may have the following five connection leads: (1) a power connection lead, (2) a ground connection lead, (3) a lead to connect to external LED 260, (4) a lead for connecting to the output of comparator 500, and (5) a lead for connecting transimpedence amplifier 300 to external resistor 335.

Figure 4:
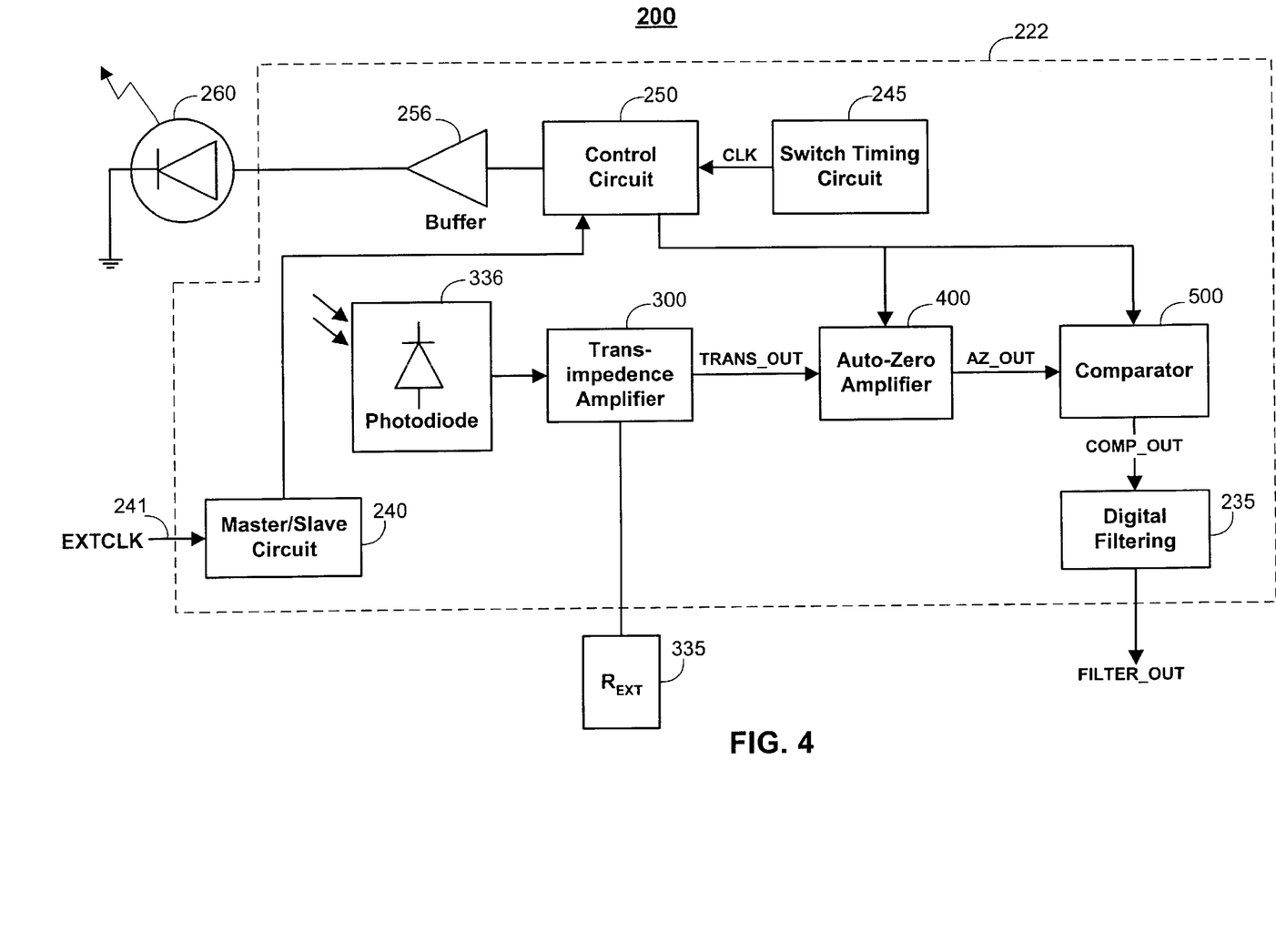
FIG. 4 is a block diagram of a more sophisticated photodetector circuit constructed in accordance with the principles of the present invention.

Photodetector 200 can be further improved by as shown in FIG. 4 by adding digital filter 235, master/slave circuit 240, and control circuit 250.

As FIG. 4 shows, digital filter 235 may be coupled to the output of comparator 500. Digital filter 235 preferably includes filter circuitry that can accumulate and interpret output signals it receives from comparator 500 (e.g., up/down counter circuitry). Such circuitry may produce output signals that are indicative of the of input signals received. For example, if comparator 500 produces four consecutive logic high signals, digital filter 235 may respond by generating a logic high at its output. Digital filter 235 may be configured so that its output (FILTER_OUT) remains at a certain logic state until it receives a series of input signals from comparator 500 that cause it to change. For example, comparator 500 may remain at a logic high until four consecutive logic low signals are received from comparator 500. Performing such filtering increases the likelihood that the output of digital filter 235 will accurately reflect the conditions sensed by photodiode 336, thereby increasing the accuracy of photodetector 200.

Another way to improve the performance of photodetector 200 is to control the operational periods of some of the above-mentioned circuits individually. It is desirable to do this because when photodetector 200 is changing from one phase of operation to another (i.e., from active mode to standby mode and vice versa) it is not necessary that all of the circuitry change state simultaneously, or that the all circuitry remain active for the same amount of time. The purpose of control circuit 250 (which may include a frequency divider circuit or any other suitable clock generation circuitry) is to coordinate the operational periods of certain circuitry within photodetector 200 with respect to the operation of LED 260. Control circuit 250 accomplishes this by periodically creating additional control signals (i.e., DATA_1 and DATA_2) from the DATA_ON signal.

Both the DATA_ON and DATA_1 control signals are connected to comparator 500 and auto-zero amplifier 400. Whether amplifier 400 and comparator 500 are enabled or disabled depends upon the logic level of the DATA_ON and DATA_1 control signals. For example, when DATA_ON is a logic high, a group of switches designated "S1" within amplifier 400 and comparator 500 (shown in FIGS. 6 and 7) are closed, disabling both of these circuits. This places photodetector 200 in a standby mode. However, when the DATA_ON signal changes from a logic high to a logic low, the S1 switches are opened so that amplifier 400 and comparator 500 are longer disabled. After a short delay period, control circuit 250 generates a DATA_1 control signal. While the DATA_1 signal is a logic high, a set of switches designated "S2" within amplifier 400 and comparator 500 (FIGS. 6 and 7) close, enabling these circuits. Shortly afterward, control circuit 250 generates a DATA_2 control signal, which turns ON LED 260 and connects auto-zero amplifier 400 to comparator 500. At this point, photodetector 200 is fully active and is ready to acquire and report data.

From the above it can be seen that when photodetector 200 transitions from standby to active mode, control circuit 250 preferably enables amplifier 400 and comparator 500 first, and then turns LED 260 ON. This provides some settling time for amplifier 400 and comparator 500 to overcome any internal or transient delays, so that photodetector 200 is fully active when LED 260 is subsequently pulsed ON.

Figure 8:
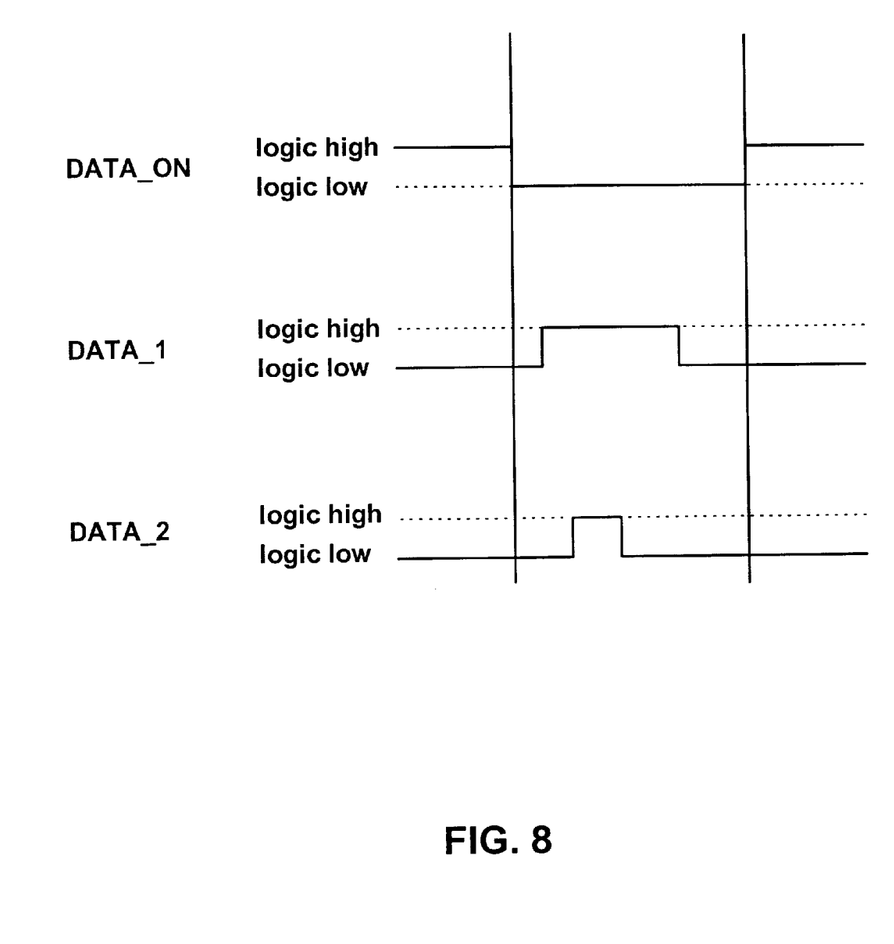
FIG. 8 is a timing diagram that illustrates a sequence for generating control signals.

When changing from an active to a standby mode, control circuit 250 preferably disables circuitry in a manner opposite to that described above (i.e., LED 260 is turned OFF first, and comparator 500 and amplifier 400 are disabled following a delay period). Control circuit 250 does this by: (1) first changing DATA_2 from a logic high to a logic low, (2) then, after a delay, changing DATA_1 from a logic high to a logic low, and (3) following a second delay, changing DATA_ON from a logic low to a logic high. This shutdown sequence reduces the amount of time LED 260 is ON to only a relatively small portion of the time that photodetector 200 is active, further reducing power consumption. In addition, disabling amplifier 400 and comparator 500 shortly after LED 260 is turned OFF decreases the possibility of photodetector 200 reporting a spurious signal. A timing diagram illustrating the preferred enable/disable sequence is shown in FIG. 8.

As shown in FIG. 4, master/slave circuit 240 is coupled to control circuit 250 and allows photodetector 200 to operate as either a "master" or a "slave." For example, if input 241 (EXTCLK) is set to a predetermined logic level (e.g., a logic low or a logic high), master/slave circuit 240 sends a select signal to control circuit 250 configuring photodetector 200 as a master. When configured as a master, photodetector 200 internally generates its own control signals (i.e., DATA_ON, DATA_1, and DATA_2) based on a clock (CLK) signal generated in switch timing circuit 245.

Alternatively, when input 241 is connected to an varying logic signal (e.g., an external clock signal), master/slave circuit 240 sends a select signal to control circuit 250 configuring photodetector 200 as a slave. When configured as a slave, control circuit 250 generates control signals based on the external signal (EXTCLK) it is connected to rather than the CLK signal. In certain embodiments, switch timing circuit 245 may be turned OFF when photodetector 200 is configured as a slave to further conserve power.

It will be apparent from the above that several photodetectors 200 may be connected together to form a motion detector. One way this may be done is by arranging a group of photodectectors 200 in a somewhat vertical or horizontal pattern (not shown), depending on the desired application. The amount of time each photodetector is active may be divided into separate periods and allocated to each photodetector so that only one particular photodetector 200 in the group is active for a given period time. This may done, for example, by providing an external clock signal (EXTCLK) to master/slave circuit 240 during the allocated period so that each photodetector 200 is active only during that period. Each photodetector 200 within the group may process light signals emitted and/or received within the time interval allocated to it. By examining the output of each photodetector 200 during its allocated active time period, the position or motion of an object may be determined. Implementing a motion or position detector in is way is desirable because it prevents nearby photodetectors from acquiring and reporting stray light signals created by the active photodetector.

If desired, portions of photodetector circuit 200 can be fabricated on a single "chip" or integrated circuit (e.g., as a DIP (dual in-line package) or a "can" type package, etc.). For example, the circuit elements contained within dotted line 222 (i.e., buffer 256, control circuit 250, switch timing circuit 245, master/slave circuit 240, photodiode 336, transimpedence amplifier 300, auto-zero amplifier 400, comparator 500, and digital filter 235) may be included on one integrated circuit. In the case of a can type package, the "top" portion of the can may have an aperture region that allows light emitted by LED 260 to pass through and strike photodiode 336. The "bottom" portion of the can may contain a number of connection leads for connecting to external circuitry. For example, the bottom may have the following six connection leads: (1) a power connection lead, (2) a ground connection lead, (3) a lead to connect to external LED 260, (4) a lead for connecting to the output of digital filter 235, (5) a lead for connecting transimpedence amplifier 300 to external resistor 335 and (6) a lead for connecting to external signals to master/slave circuit 240.

Figure 5:
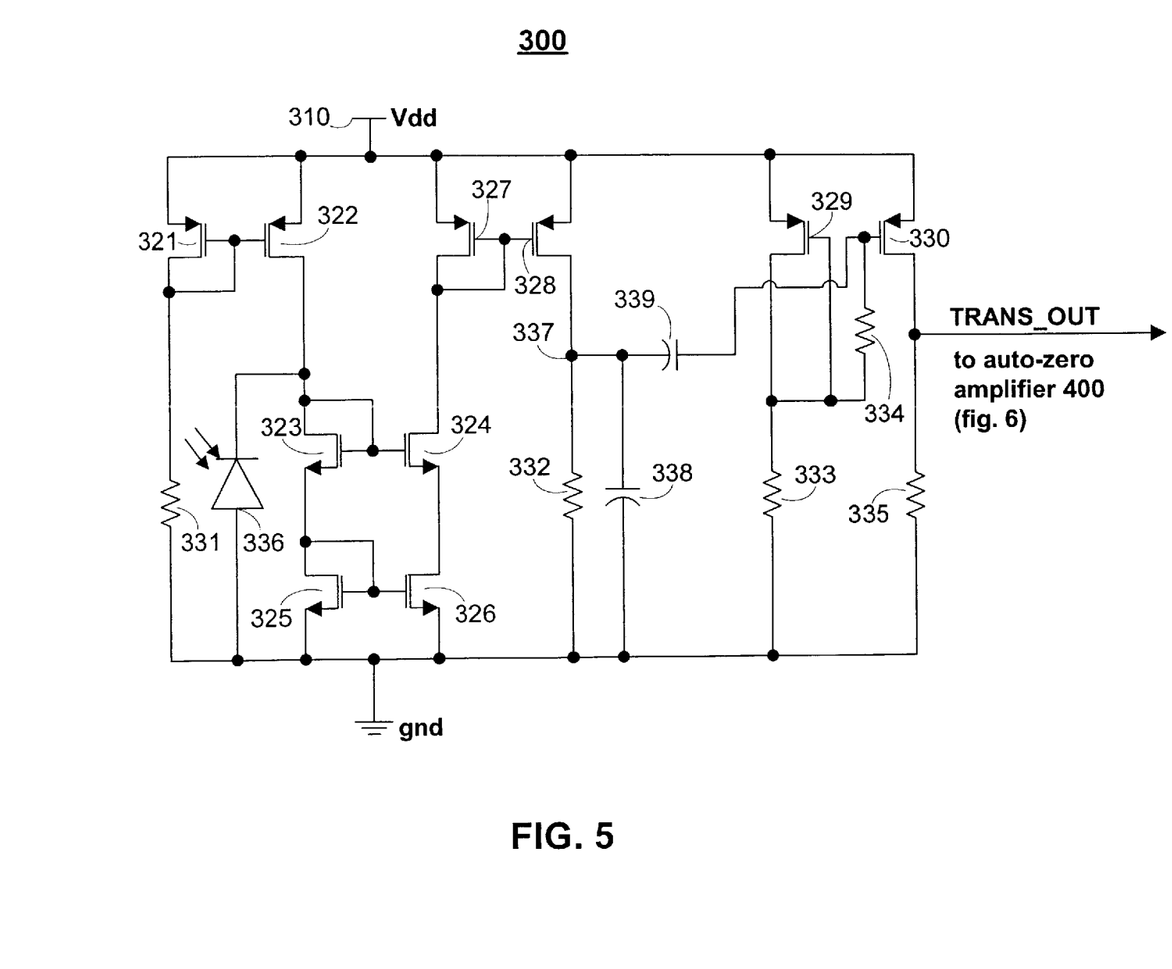
FIG. 5 is a schematic diagram of a transimpedance amplifier circuit constructed in accordance with the principles of the present invention.

A schematic diagram of a preferred embodiment of transimpedence amplifier 300 is shown in FIG. 5. As FIG. 5 shows, transimpedence amplifier 300 includes integrated photodiode 336, capacitors 338–339, resistors 331–335, and transistors 321–330. Integrated photodiode 336 may be fabricated using an N-well in a P-substrate with dimensions of about 500 $\mu$m×500 $\mu$m and a spectral sensitivity of about 0.4 A/W. However, these specifications are only exemplary, and other materials, sizes, and spectral sensitivities may be used if desired. In addition, it is important to note that photodiodes in general are only sensitive to light within a certain bandwidth (e.g., infrared). Therefore, care should be taken to fabricate photodiode 336 so that its sensitivity range is compatible with that of commercially available LEDs.

As shown FIG. 5, when a sufficient voltage is applied to Vdd terminal 310 of transimpedence amplifier 300, a current mirror formed by resistor 331 and P-channel transistors (PMOS) 321–322 starts to conduct and reverse-biases photodiode 336. Assuming that no light within a specified bandwidth strikes photodiode 336, it behaves similar to an open circuit and conducts substantially no current (except for a small "dark current" which is discussed in more detail below).

As current flows through PMOS transistor 322, diode connected N-channel transistors (NMOS) 323 and 325 turn ON start to conduct. This causes the other transistors (i.e., 324 and 326) in the cascode-connected current mirror formed by NMOS transistors 323–326 to also turn ON and conduct. While NMOS transistors 324 and 326 are ON, a voltage is generated at the common gate of PMOS transistors 327 and 328 which turns them ON. This causes a current to flow through resistor 332 connected to the source of PMOS transistor 328, generating a voltage at node 337. The voltage at node 337 controls the gate-source voltage ($V_{GS}$) of PMOS transistor 330. As the voltage at node 337 increases, the gate-source voltage of PMOS transistor 330 decreases, turning OFF transistor 330. Thus, when substantially no light signal is incident upon photodiode 336, the output voltage of amplifier 300 substantially zero.

However, when a sufficient amount of light is incident upon photodiode 336, it starts to conduct, diverting current away from diode-connected NMOS transistors 323 and 325. This causes the amount of current drawn by NMOS transistors 324 and 326 to decrease, thereby lowering the voltage at the common gate of PMOS transistors 327 and 328. This reduces the current flow through resistor 332 causing the voltage at node 337 to drop-off which, in turn, causes the gate-source voltage of PMOS transistor 330 to increase. As the gate-source voltage increases, PMOS transistor 330 begins to turn ON so that a current produced at its source terminal. This current passes through external resistor 335 generating output voltage TRANS_OUT. As the intensity of the light signal on photodiode 336 increases, the amount of current diverted away from diode-connected NMOS transistors 323 and 325 increases, further increasing the output voltage of amplifier 300. The output voltage (TRANS_OUT) of amplifier 300 is generally proportional to the intensity of the light impinging on photodiode 336.

By properly choosing the temperature coefficient of external resistor 235, the total gain of photodetector 200 (which is temperature dependent) can be adjusted substantially linearly. This allows user to change the sensitivity of photodetector 200 so that it suitable for detecting light signals of varying intensity over a broad range of temperatures. For example, if is desired to use photodetector 200 as a proximity detector, its gain may be adjusted to sense objects at a relatively far distance (with a high gain) or at a relatively short distance (with a low gain) substantially independent of temperature. An additional benefit of this configuration is that only one external pin required to adjust the gain of photodetector 200. This is a significant improvement over prior art systems that typically need two pins to connect a feedback resistor to an operational amplifier to adjust system gain.

In FIG. 5, the purpose of capacitor 338 is to band-limit the frequency of the signal at node 337 so that high frequency signals and noise are filtered out. The input signal at node 337 is AC-coupled through capacitor 339. Capacitor 339 and resistor 334 form a high-pass filter that cancels-out a DC offset created by a small current signal that is produced by photodiode 336 when substantially no light is incident upon it (i.e., the "dark current"). PMOS transistor 329 and resistor 333 provide additional voltage to bias the gate of PMOS transistor 330. As mentioned above, the value of external resistor 335 may be selected by the user to set the gain of amplifier 300. Generally speaking, as the value of external resistor 235 is increased the voltage gain of amplifier 300 increases and vice versa.

Figure 6:
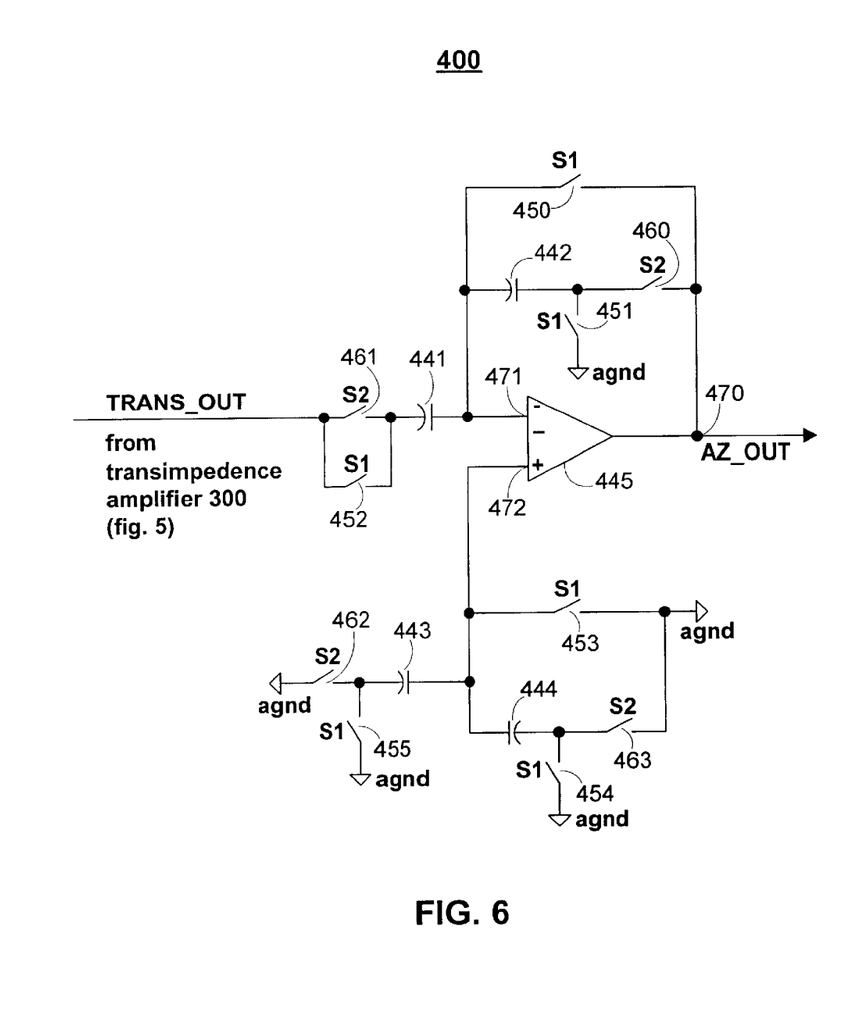
FIG. 6 is a schematic diagram of an auto-zero amplifier circuit constructed in accordance with the principles of the present invention.

The output voltage (TRANS_OUT) produced by transimpedence amplifier 300 is further amplified by auto-zero amplifier 400. As shown In FIG. 6, auto-zero amplifier 400 includes S1 switches 450–455, S2 switches 460–463, capacitors 441–444, and operational amplifier op-amp) 445. The output of transimpedence amplifier 300 (TRANS_OUT) is coupled to an inverting input 471 of op-amp 445 through parallel coupled switches 452 and 461 and capacitor 441. A feedback network is coupled from output 470 of op-amp 445 to its inverting input 471 that includes switches 450–451, 460, and capacitor 442. As shown in FIG. 6, when S2 switch 460 is closed and S1 switches 450–451 are open, a feedback path from output 470 to inverting input 471 results through capacitor 442. In this instance, op-amp 445 is configured as an integrator and can amplify signals received from transimpedence amplifier 300 (this is the enabled mode of auto-zero amplifier 400). However, when S2 switch 460 is open and S1 switches 450–451 are closed, both inverting input 471 and output 470 are shorted to ground (this is the disabled mode of auto-zero amplifier 400).

A non-inverting input 472 of op-amp 445 is coupled to ground through a network that includes S1 switches 453–455, S2 switches 462–463, and capacitors 443–444. As shown in FIG. 6, when S2 switches 462–463 are closed and S1 switches 453–455 are open (during the enabled mode) so that non-inverting input 472 is coupled to ground through parallel-connected capacitors 443 and 444. This matches the network seen by inverting input 471 when op-amp 445 is configured as an integrator. When S2 switches 462–463 are open and S1 switches 453–455 are closed (during the disabled mode), non-inverting input 472 is coupled in parallel to ground and parallel-connected capacitors 443 and 444. This matches the network seen by inverting input 471 when op-amp 445 is disabled.

Note that the circuitry connected to non-inverting input 472 is a virtual "copy" of the network connected to inverting input 471. This provides auto-zero amplifier 400 with design symmetry that tends to cancel out non-linearities such as clock feed-through and 1/f noise experienced during switching intervals. Switches 452 and 461 are also provided for design symmetry and aid in canceling out clock feed-through. It will be understood, however, that the network connected to non-inverting input 472 represents a preferred embodiment of the present invention and is not essential for operation. For example, non-inverting input 472 could be connected directly to ground without seriously affecting the operation of auto-zero amplifier 400.

While auto-zero amplifier 400 is disabled, output 470 is connected to ground through S1 switches 450–451. However, when DATA_ON changes from a logic high to a logic low, the S1 switches are opened and control circuit 300 generates a DATA_1 signal. This causes S2 switches 460–461 to close, enabling amplifier 400. At this point, auto-zero amplifier 400 is ready to amplify input signals from transimpedence amplifier 300. Following a short delay, control circuit 250 generates a DATA_2 control signal that pulses external LED 260 ON. If an object is present, a portion of the light signal emitted from LED 260 will reflect onto photodiode 336 causing transimpedance amplifier 300 to produce an output signal (TRANS_OUT). Auto-zero amplifier 400 further amplifies the TRANS_OUT signal producing AZ_OUT which is coupled to input of comparator 500 shown in FIG. 7.

Figure 7:
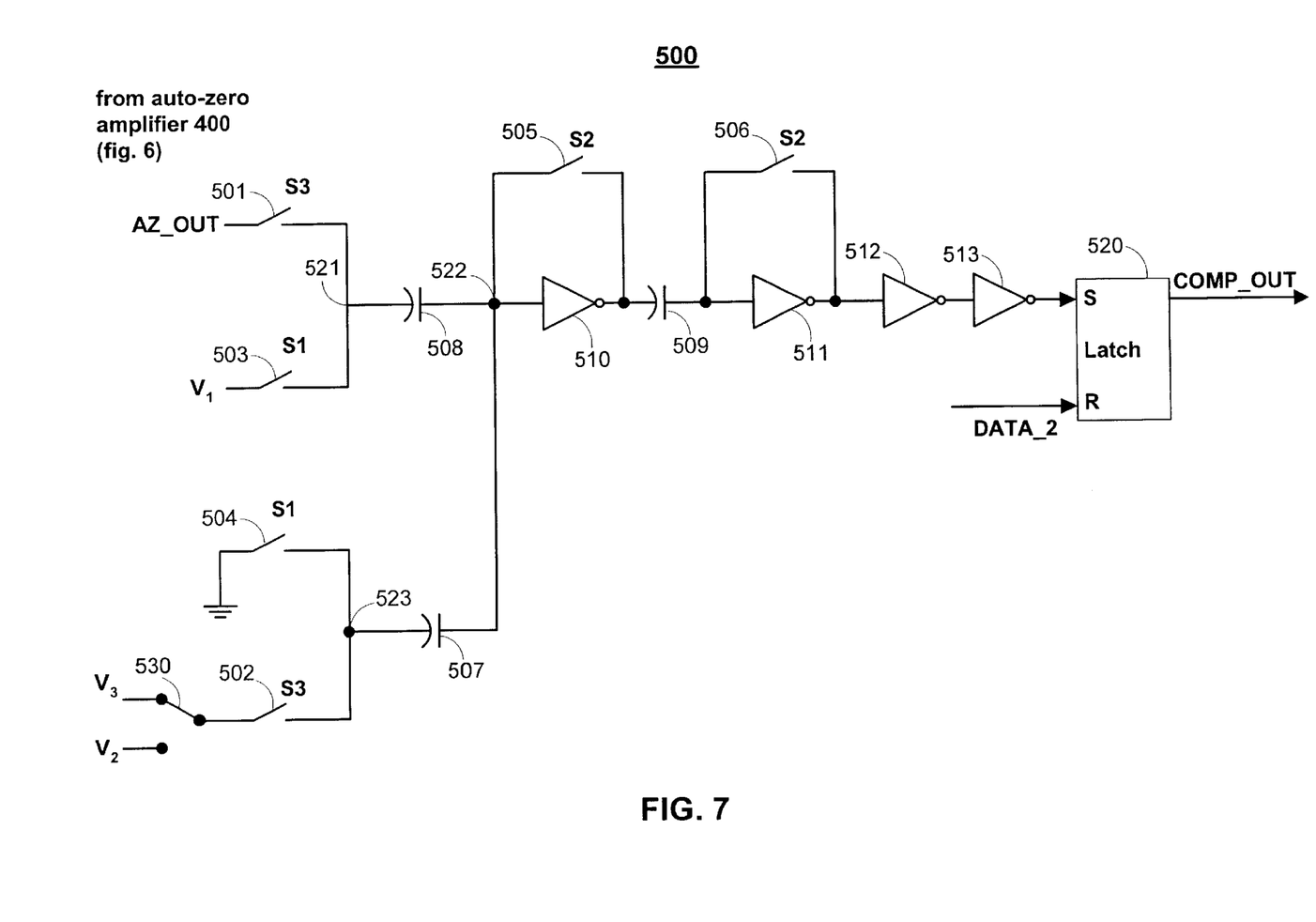
FIG. 7 is a schematic diagram of a comparator circuit constructed in accordance with the principles of the present invention.

As shown in FIG. 7, comparator circuit 500 may include S1 switches 503–504, S2 switches 505–506, S3 switches 501–502, capacitors 507–509, invertors 510–513, latch 520, and two-position switch 530. Invertors 510–513 are connected in series with the output of invertor 513 coupled to the set input of latch 520. The input of invertor 510 is connected to capacitors 507–508 and to S2 switch 505. The input of invertor 510 may couple to AZ_OUT through S3 switch 501 or to a threshold voltage V1 (e.g., 2.5 V) through S2 switch 503. Invertor 510 may also couple to ground through S1 switch 504 or to hysterisis voltages V2 (e.g., 0.3 V) or V3 (e.g., 0.5 V) through S3 switch 502 and two-position switch 530.

During standby mode, S1 switches 503–504 are closed, and S2 switches 505–506 and S3 switches 501–502 are open. During this period, node 521 is connected to threshold voltage V1 and node 523 is coupled to ground through S1 switch 504. During the next mode of operation, however, (i.e., the active mode), the DATA_ON signal becomes a logic low, opening S1 switches 503–504 and DATA_1 becomes a logic high closing S2 switches 505–506. Next, the DATA_2 signal becomes a logic high closing S3 switches 501–502. During this period, node 521 is connected to AZ_OUT and node 523 is coupled to hysterisis voltage V3 (assuming latch 520 previously reported a logic low, otherwise node 523 would be coupled to hysterisis voltage V2). When comparator 500 enters standby again, invertor 510 will "compare" the previously received AZ_OUT signal with threshold voltage V1. If the difference between the AZ_OUT signal and V1 is greater than the value of V3, the output of invertor 513 and latch 520 to becomes a logic high. On the other hand, if the difference between the AZ_OUT signal and V1 is less than V3, the output of invertor 513 and latch 520 to output a logic low.

The output of latch 520 determines whether two-position switch 530 is connected to hysterisis voltage V3 or V2. When the output of latch 520 is a logic low, two-position switch 530 is connected to hysterisis voltage V3 (e.g., 0.5 volts). However, when the output of latch 520 is a logic high, two-position switch 530 is connected to hysterisis voltage V2 (e.g., 0.3 volts). This provides comparator 500 with an amount of hysterisis equal to the difference between the values hysterisis voltages V3 and V2 (e.g., about 0.2 volts).

To illustrate the above-described comparison in more detail, consider the following example. During the standby mode, node 521 is connected to threshold voltage V1, (e.g., 2.5 volts) through S1 switch 504 causing capacitor 508 to charge to the threshold voltage. Capacitor 507 is connected to ground through S1 switch 504. When the active mode occurs, S1 switches 503–504 are opened and S2 switches 505 and 506 are closed. This causes capacitor 508 to charge capacitor 509 to the threshold voltage V1 (2.5 volts). Next, the DATA_2 signals becomes a logic high and S3 switches 501 and 502 close. This causes capacitor 508 to charge to the value of AZ_OUT (e.g., 1.9 volts) and capacitor 507 to charge to the value of hysterisis voltage V3 (e.g., 0.5 volts).

When comparator 500 returns to the standby mode, node 521 has to change from 1.9 volts to back to the V1 threshold voltage. This means that node 521 has to change from 1.9 volts to 2.5 volts, a difference of about 0.6 volts. At the same time node 523 has to change from 0.5 volts to ground, a difference of a bout 0.5 volts. This creates a net voltage change of about 0.1 volts at node 522 which is amplified by invertors 510–513 to produce a logic high at the output of invertor 513. In this case, the output of latch 520 causes two-position switch 530 to disconnect from hysterisis voltage V3 and connect to hysterisis voltage V2.

The output of invertor 513 may be applied to one input of latch 520. The DATA_2 signal may be connected to the other input of latch 520. Thus, the data generated by latch 520 may only be valid while comparator 500 is in the standby mode.

The S1, S2, and S3 switches of the present invention are preferably implemented using CMOS transmission gates, but any suitable switching elements may be used if desired. For example, the S1, S2, and S3 switches may implemented using either of the below-described transmission gates 610 or 620.

Figure 9:
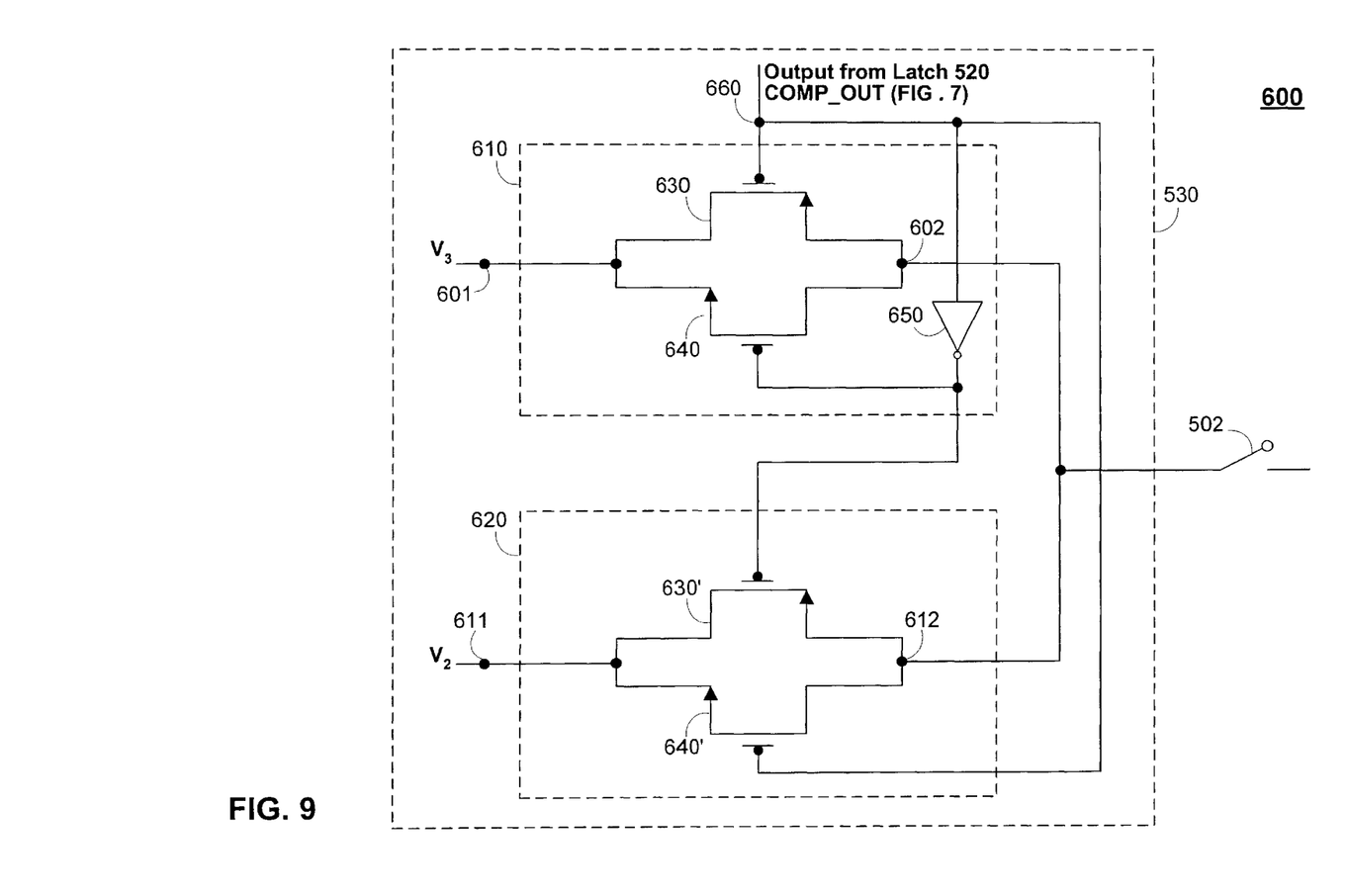
FIG. 9 is a schematic diagram of switches that are implemented using CMOS transmission gates.

As shown in FIG. 9 two-position switch 530 may be implemented using parallel-coupled transmission gates 610 and 620. Transmission gates 610 and 620 may include NMOS transistors 640 and PMOS transistors 630 that are connected to one another such that the drain of PMOS 630 is connected to the source of NMOS 640 and vice versa (although this may "switch" during operation). An inverter 650 is connected between the gates of the transistors within transmission gate 610 (i.e., PMOS 630 and NMOS 640) so that a signal applied to the gate of one transistor (e.g., PMOS 630) is inverted at the gate of the other transistor (e.g., NMOS 640). This allows both transistors of transmission gate 610 to be ON or OFF when control input 660 is a logic low or a logic high, respectively. The opposite is true for transmission gate 620 (i.e., gate 620 is OFF when control input 660 is a logic low and ON when control input 660 is a logic high).

As FIG. 9 shows, input 611 of transmission gate 620 is connected to hysterisis voltage V2 and input 601 of transmission gate 610 is connected to the hysterisis voltage V3. Control input 660 is connected to the output of latch 520 (COMP_OUT) and to the gates of PMOS and NMOS transistors within transmission gates 610 and 620. If the signal applied to control input 660 is a logic low, NMOS transistor 640' and PMOS transistor 630' in transmission gate 620 are OFF while NMOS transistor 640 and PMOS transistor 630 in transmission gate 610 are ON. This allows the V3 hysterisis voltage to pass from input 601 of transmission gate 610 to output 602. In this way, hysterisis voltage V3 may be selectively connected to capacitor 507.

However, if the signal applied to control input 660 is a logic high, NMOS 640' and PMOS 630' in transmission gate 620 are ON while NMOS 640 and PMOS 630 in transmission gate 610 are OFF. This allows hysterisis voltage V2 to pass from input 611 of transmission gate 620 to output 612. In this way, capacitor 507 may be selectively connected to hysterisis voltage V2. Because the NMOS and PMOS transistors of only one transmission gate (610 or 620) can be ON at any given time, either hysterisis voltage V2 or V3 can be connected to capacitor 507 at any one time.

Persons skilled in the art will appreciate that the present invention can be practiced by other than the described embodiments, which are presented for purposes of illustration and not of limitation, and the present invention is limited only by the claims which follow.

The invention claimed is:

1. A photodetector circuit comprising;
   a switch timing circuit that periodically generates a first control signal;
   a photodiode circuit that produces a first signal in response to a light signal incident upon said photodiode circuit;
   a first amplifier circuit coupled to said photodiode circuit that receives and amplifies said first signal such that said first amplifier circuit generates a second signal that is indicative of said first signal; and
   a second amplifier circuit coupled to said switch timing circuit, said second amplifier circuit configured to receive said second signal and generate a third signal indicative of said second signal when said first control signal is received from said switch timing circuit.

2. The circuit of claim 1 disposed on an integrated circuit device.

3. The circuit defined in claim 1 further comprising a comparator circuit having hysterisis coupled to said switch timing circuit and to said second amplifier circuit, said comparator circuit configured to receive and compare said third signal to a threshold value, said comparator circuit producing an output signal in response to said comparison.

4. The circuit defined in claim 3 wherein said comparator circuit performs said comparison when said first control signal is received from said switch timing circuit.

5. The circuit defined in claim 3 wherein said comparator output signal is indicative of an intensity of said light signal incident upon said photodiode circuit.

6. The circuit defined in claim 1 wherein said first amplifier is a variable gain transimpedence amplifier.

7. The circuit defined in claim 1 wherein said transimpedence amplifier has a variable gain that can be selected by coupling an external resistor to said transimpedence amplifier.

8. The circuit defined in claim 7 wherein a sensitivity of the photodetector circuit varies in a substantially linear fashion when said gain of said transimpedence amplifier is changed.

9. The circuit defined in claim 1 further comprising an invertor circuit having an input and an output and wherein said invertor input is configured to receive said first control signal.

10. The circuit defined in claim 9 wherein said invertor circuit output is coupled to an external light emitting diode, said light emitting diode turning on and off as directed by said first control signal.

11. A photodetector circuit capable of dual-mode operation in which the photodetector circuit: (1) generates at least one output signal indicative of light intensity during a first mode of operation, and (2) enters a standby state in a second mode operation during which no output signals are generated and portions of the photo-detector circuit are shutdown or disabled in order to reduce overall power consumption, the photodetector circuit comprising:
   a control circuit that periodically generates first and second control signals, the photodetector circuit being in the first mode of operation when said first control signal is generated and the photodetector circuit being in the second mode of operation when said second control signal is generated;

a photodiode circuit that produces a first signal in response to a light signal incident upon said photodiode circuit;

a first amplifier circuit coupled to said photodiode circuit that produces a second signal in response to said first signal; and a second amplifier circuit that is coupled to said switch timing circuit and said first amplifier circuit that receives and amplifies said second signal such that said second amplifier circuit generates a third signal that is indicative of said second signal; said second amplifier circuit amplifying said second signal in response to said first control signal.

12. The circuit defined in claim 11 further comprising a comparator circuit having hysterisis coupled to said control circuit and to said second amplifier circuit, said comparator circuit configured to receive and compare said third signal to a threshold value, said comparator circuit producing an output signal in response to said comparison.

13. The circuit defined in claim 12 wherein said comparator circuit performs said comparison when said first control signal is received from said control circuit.

14. The circuit defined in claim 12 wherein said comparator output signal is indicative of an intensity of said light signal incident upon said photodiode circuit.

15. The circuit defined in claim 12 further comprising a digital filter circuit coupled to an output of said comparator circuit that filters said comparator output signals.

16. The circuit defined in claim 15 wherein said digital filter circuit includes up/down counter circuitry that accumulates and interprets said output signals received from said comparator circuit.

17. The circuit defined in claim 11 wherein said first amplifier circuit is a variable gain transimpedence amplifier.

18. The circuit defined in claim 17 wherein said transimpedence amplifier further comprises a first current mirror circuit coupled to said photodiode that back-biases said photodiode when said first current mirror circuit is conducting.

19. The circuit defined in claim 18 wherein said transimpedence amplifier further comprises a second current mirror circuit coupled to said photodiode that amplifies said first signal.

20. The circuit defined in claim 19 wherein said transimpedence amplifier further comprises an output transistor coupled to said second current mirror circuit that further amplifies said first signal.

21. The circuit defined in claim 20 wherein said transimpedence amplifier further comprises an external resistor coupled to said output transistor and wherein a value of said external resistor sets a gain of said transimpedence amplifier such that said transimpedence amplifier generates said second signal.

22. The circuit defined in claim 11 wherein said second amplifier circuit is an auto-zero amplifier circuit.

23. The circuit defined in claim 22 wherein said auto-zero amplifier is configured as an integrator and amplifies said second signal in order to produce said third signal when said auto-zero amplifier receives said first control signal.

24. The circuit defined in claim 22 wherein said auto-zero amplifier is initialized and produces a substantially zero output signal when said auto-zero amplifier receives said second control signal.

25. The circuit defined in claim 11 further comprising a switch timing circuit coupled to said control circuit that produces a clock signal, said control circuit generating said first and second control signals based on the clock signal received from said switch timing circuit.

26. The circuit defined in claim 25 wherein said switch timing circuit further comprises an oscillator circuit.

27. The circuit defined in claim 11 further comprising a master/slave configuration circuit having an input and an output wherein said photodetector circuit operates as a master when a fixed logic level signal is applied to said master/slave input such that said photodetector circuit and internally generates said first and second control signals.

28. The circuit defined in claim 11 further comprising a master/slave configuration circuit having an input and an output wherein said photodetector circuit operates as a slave when an external clock signal is applied to said master/slave input such that said photodetector circuit and generates said first and second control signals based on said external clock signal.

29. The circuit defined in claim 25 wherein said control circuit generates a third control signal based on said clock signal during said first mode of operation.

30. The circuit defined in claim 29 further comprising a buffer circuit having an input and an output wherein said invertor input is configured to receive said third control signal.

31. The circuit defined in claim 30 wherein said buffer output is coupled to an external light emitting diode, said light emitting diode turning on and generating a light signal when said buffer circuit receives said third control signal.

32. The circuit defined in claim 31 wherein at least a portion of said light signal is reflected from an object onto said photodiode, said photodiode producing said first signal in response to said portion of a light signal.

33. A method for detecting a light signal with a photodetector circuit, the method comprising:

periodically generating a first control signal with a switch timing circuit;

producing a first signal in response to a light signal incident upon a photodiode circuit;

generating a second signal indicative of said first signal with a first amplifier circuit coupled to said photodiode circuit; and generating a third signal indicative of said second signal with a second amplifier circuit coupled to said first amplifier circuit when said second amplifier circuit receives a first control signal from said switch timing circuit.

34. The method of claim 33 wherein said photodetector circuit further comprises a comparator circuit having hysterisis coupled to said switch timing circuit, the method further comprising:

receiving said third signal with said comparator circuit, said comparator circuit configured to compare said third signal to a threshold value, said comparator circuit producing an output signal in response to said comparison.

35. The method of claim 35 further comprising performing said comparison when said first control signal is received from said switch timing circuit.

36. A method of detecting a light signal with a photodetector circuit wherein the photodetector circuit operates in a dual-mode fashion during which the photodetector circuit: (1) generates at least one output signal indicative of light intensity during a first mode of operation, and (2) enters a standby state in second mode operation during which no output signals are generated and portions of the photodetector circuit are shutdown or disabled in order to reduce overall power consumption, the method comprising:

periodically generating first and second control signals with a control circuit, the photodetector circuit being in the first mode of operation when said first control signal is generated and the photodetector circuit being in the second mode of operation when said second control signal is generated;

producing a first signal in response to a light signal incident upon a photodiode circuit;

generating a second signal indicative of said first signal with a first amplifier circuit coupled to said photodiode circuit; and     creating a third signal indicative of said second signal with a second amplifier circuit coupled to said first amplifier circuit when said second amplifier circuit receives said first control signal from said control circuit.

37. The method of claim 36 wherein said photodetector circuit further comprises a comparator circuit having hysterisis coupled to said control circuit, the method further comprising:

receiving said third signal with said comparator circuit, said comparator circuit configured to compare said third signal to a threshold value, said comparator circuit producing an output signal in response to said comparison.

38. The method of claim 37 further comprising performing said comparison when said first control signal is received from said control circuit.

39. The method of claim 37 wherein said photodetector circuit further comprises a digital filter circuit coupled to the output of said comparator circuit, the method further comprising filtering said comparator output signals.

40. The method of claim 39 wherein said digital filter circuit further comprises up/down counter circuitry, said filtering further comprising accumulating and interpreting the output signals received from said comparator circuit.

41. The method of claim 36 wherein said first amplifier circuit is a variable gain transimpedance amplifier that includes a first current mirror circuit and a photodiode, said generating further comprising back-biasing said photodiode when said first current mirror circuit is conducting.

42. The method of claim 41 wherein said transimpedence amplifier circuit includes a second current mirror circuit, said generating further comprising amplifying said first signal with said second current mirror circuit.

43. The method of claim 42 wherein said transimpedence amplifier further comprises an output transistor coupled to said second current mirror circuit, said generating further comprising additionally amplifying said first signal with said output transistor.

44. The method defined in claim 36 wherein said second amplifier is an auto-zero amplifier, said creating further comprising configuring said auto-zero amplifier as an integrator so that said auto-zero amplifier amplifies said second signal in order to produce said third signal when said auto-zero amplifier receives said first control signal.

45. The method defined in claim 36 wherein said second amplifier is an auto-zero amplifier, said creating further comprising initializing said auto-zero amplifier so that said auto-zero amplifier produces a substantially zero output signal when said auto-zero amplifier receives said second control signal.

46. The method defined in claim 36 wherein the photodetector circuit includes a switch timing circuit coupled to said control circuit that produces a clock signal, said periodically generating further comprising generating said first and second control signals based on the clock signal received from said switch timing circuit.

47. The method defined in claim 36 wherein said photodetector circuit further comprises a master/slave configuration circuit having an input and an output, said method further comprising configuring said photodetector circuit to operate as a master when a fixed logic level signal is applied to said master/slave input such that said photodetector circuit and internally generates said first and second control signals.

48. The method defined in claim 36 wherein said photodetector circuit further comprises a master/slave configuration circuit having an input and an output, said method further comprising configuring said photodetector circuit to operate as a slave when an external clock signal is applied to said master/slave input such that said photodetector circuit and generates said first and second control signals based on said external clock signal.

* * * * *